United States Patent [19]

Hijikata et al.

[11] 4,318,767
[45] Mar. 9, 1982

[54] APPARATUS FOR THE TREATMENT OF SEMICONDUCTOR WAFERS BY PLASMA REACTION

[75] Inventors: Isamu Hijikata, Tokyo; Akira Uehara, Yokohama; Hisashi Nakane, Kawasaki, all of Japan

[73] Assignee: Tokyo Ohka Kogyo Kabushiki Kaisha, Kanagawa, Japan

[21] Appl. No.: 208,845

[22] Filed: Nov. 20, 1980

[30] Foreign Application Priority Data

Nov. 27, 1979 [JP] Japan ............................ 54-163233[U]

[51] Int. Cl.³ .............................................. C23F 1/02
[52] U.S. Cl. ................................... 156/345; 156/643; 156/646; 204/298; 422/183.04; 414/225
[58] Field of Search ............... 156/345, 643, 646, 656, 156/668; 204/164, 192 EC, 192 E, 298; 250/531; 118/50, 50.1, 620, 715, 723; 427/38, 39; 414/157, 158, 166, 196, 211, 214, 225, 749, 222

[56] References Cited

U.S. PATENT DOCUMENTS

| | | | |
|---|---|---|---|
| 4,149,923 | 4/1979 | Uehara et al. | 156/345 |
| 4,208,159 | 6/1980 | Uehara et al. | 414/225 |
| 4,252,595 | 2/1981 | Yamamoto et al. | 156/345 |

*Primary Examiner*—William A. Powell
*Attorney, Agent, or Firm*—Armstrong, Nikaido, Marmelstein & Kubovcik

[57] ABSTRACT

An apparatus for the treatment of semiconductor wafers by plasma reaction is disclosed. The apparatus comprises a first wafer carrying means for a wafer to be treated, a reaction chamber, a second wafer carrying means for a treated wafer, and a control means for driving respective elements thereof in linkage motion. The first wafer carrying means has a first arm type wafer carrying means, which comprises a pair of guide rails, a pair of sliders mounted on the guide rails, respectively, and a pair of first arms for carrying the wafer to be treated. The reaction chamber is provided with a pair of slits for taking the wafer into and out of the reaction chamber, a pair of open-close type vacuum sealing devices mounted on the slits, respectively. Similarly, the second wafer carrying means has a second arm type wafer carrying means. The first and second wafer carrying means are preferably placed in a preliminary vacuum chamber, whereby a high vacuum in the reaction chamber can readily be obtained to be suitable for use in an etching device for aluminum wiring, and the like.

7 Claims, 7 Drawing Figures

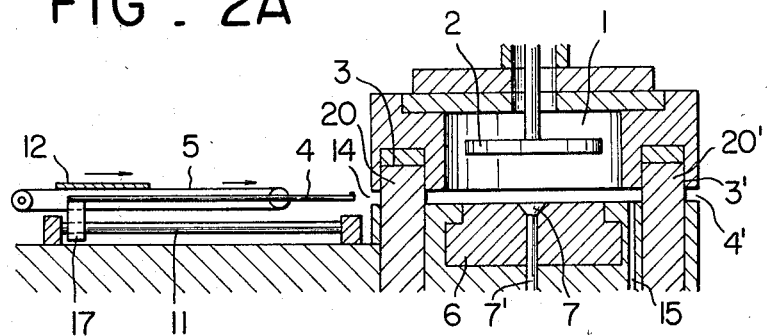
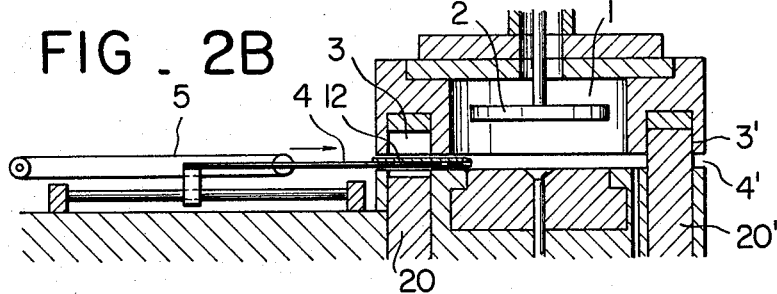
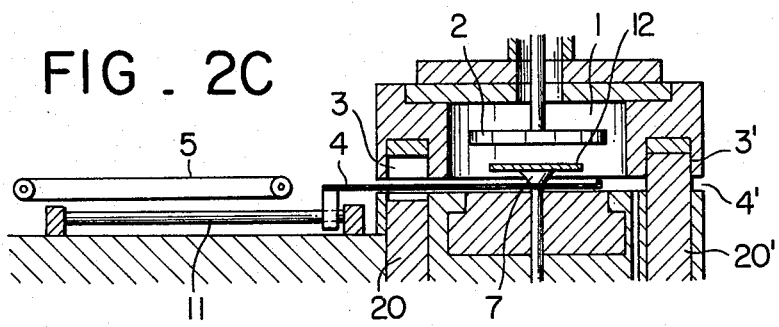
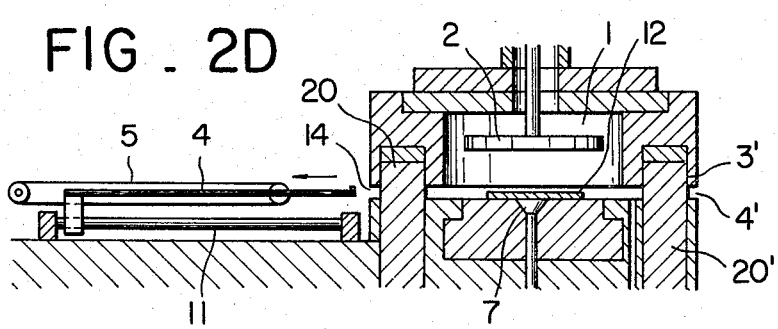

APPARATUS FOR THE TREATMENT OF SEMICONDUCTOR WAFERS BY PLASMA REACTION

BACKGROUND OF THE INVENTION (1) Field of the Invention

This invention relates to an apparatus for the automatic sheet treatment of wafers by plasma reaction, and more particularly to an apparatus for the treatment of the wafer by plasma reaction with an improved wafer carrying means.

(2) Description of the Prior Art

Recently, etching of a semiconductor wafer, as well as removal by ashing of a photoresist by use of an apparatus for the treatment of wafer materials by gas plasma reaction, has become widely available in semiconductor wafer production processes. The apparatus for the treatment of wafer by plasma reaction can be classified into two major types, that is, a batch type in which 10 to 25 sheets of wafers are set in a horizontal reaction tube for the simultaneous treatment thereof, and an in-line type in which wafers are subjected to the automatic one-by-one treatment thereof. Recently, the latter type has become widely available with the advantages such as a narrow scatter of results from the treatment of respective wafers, high processing precision, and a short treating time for each sheet of wafer. Further, various kinds of automatic wafer carrying means have been proposed.

U.S. Pat. No. 4,208,159 discloses a wafer carrying system using an arm provided with a pick up, and further discloses a wafer carrying system using a belt conveyor.

Japanese utility Model Application No. 124709/1979 discloses a wafer carrying system of a wire conveyer type, which is widely used for practical apparatuses because of its excellent advantages.

These wafer carrying systems described above are all of such a type that the vacuum of the reaction chamber is broken every time a wafer is taken in or out of the reaction chamber, and are unsuitable for such an apparatus as used in etching of an aluminium wiring, where a preliminary vacuum chamber is required to be provided for obtaining a high vacuum in the reaction chamber. However, it is very difficult to place the only wafer carrying means in the preliminary vacuum chamber due to the structure of the apparatus for the treatment of wafers by plasma reaction. Thus, the apparatus for the treatment of wafers by plasma reaction must be wholly placed in the preliminary vacuum chamber. This is very complicated and economically undesirable. Therefore, the wafer carrying means placed in the preliminary chamber is required to be compact and simplified in structure in order to obtain a high vacuum in the reaction chamber.

U.S. Pat. No. 4,149,923 also discloses an automatic apparatus for the treatment of wafer materials by plasma reaction, in which a preliminary vacuum chamber is provided before and behind the reaction chamber and all elements of the apparatus are installed on an inclined base table to effect the downward movement of the wafer as a wafer carrying means, where the wafer is stopped as required by a wafer stopper. Accordingly, there is the disadvantage that the wafer is liable to be damaged by the stopper upon stopping the wafer.

SUMMARY OF THE INVENTION

It is an object of this invention to provide an apparatus for the treatment of semiconductor wafers by plasma reaction, in which the wafer carrying means and the reaction chamber are compact and simple in structure thereof.

It is another object of this invention to provide an apparatus for the treatment of semiconductor wafers by plasma reaction, in which a high vacuum in the reaction chamber can readily be obtained by placing the wafer carrying means in a preliminary vacuum chamber.

It is yet another object of this invention to provide an apparatus for the treatment of semiconductor wafers by plasma reaction which has such advantages as a narrow scatter of results from the treatment of respective wafers, high processing precision, and a short treating time for each sheet of wafer.

BRIEF DESCRIPTION OF THE DRAWINGS

FIGS. 2(A), 2(B), 2(C), and 2(D), are explanatory front views showing a procedure for taking the wafer into the reaction chamber utilizing the apparatus of this invention.

DETAILED DESCRIPTION OF THE PREFERRED EMBODIMENTS

The present invention provides an apparatus for the treatment of semiconductor wafers by plasma reaction, which apparatus is substantially composed of a first wafer carrying means for a wafer to be treated, a reaction chamber, a second wafer carrying means for a treated wafer, and a control means for driving the first wafer carrying means, the reaction chamber, and the second wafer carrying means in linkage motion.

The apparatus of the present invention will be further described in detail with reference to the accompanying drawings.

Figure 1:
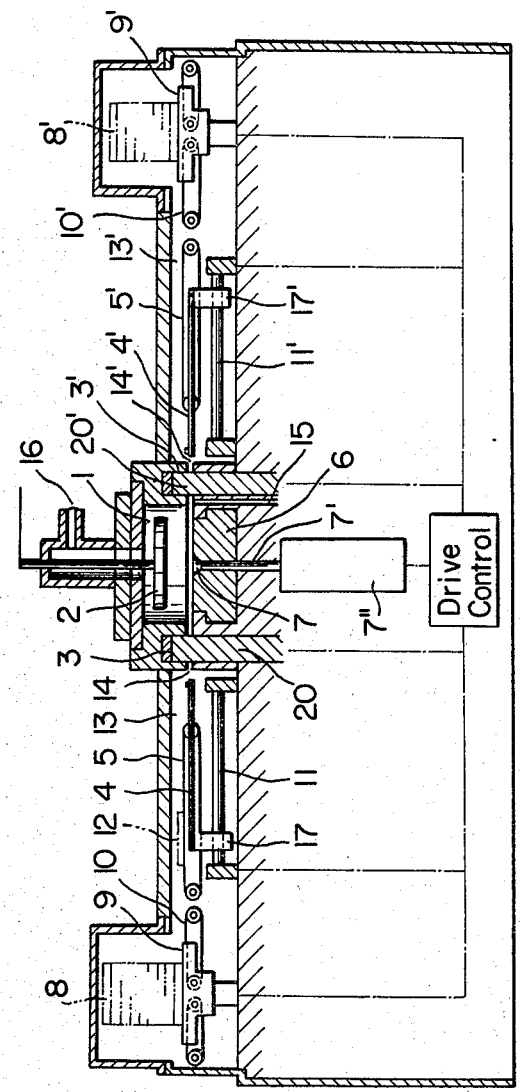
FIG. 1 is a front view showing one embodiment of the apparatus of the present invention.
Figure 3:
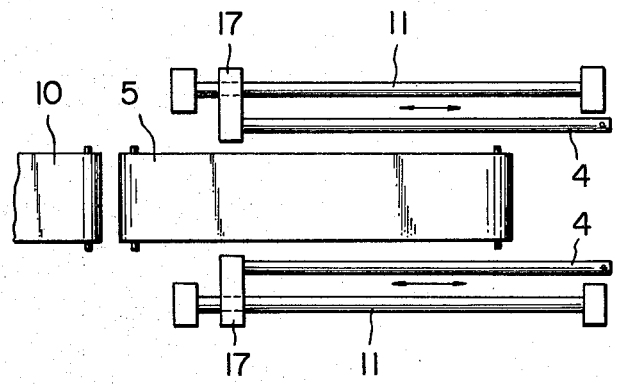
FIG. 3 is a schematic plan view showing one emobidment of a second belt conveyor for carrying a wafer to be treated and an arm type wafer carrying means for carrying a wafer to be treated according to the apparatus of this invention.

In FIGS. 1 and 3, the first wafer carrying means substantially consists of a first cassette elevator 9, a first wafer cassette 8 for the wafer to be treated which is mounted on the first cassette elevator 9, a first belt conveyer 10 for carrying the wafer to be treated and disposed adjacent to the first wafer cassette 8, a second belt conveyer 5 for carrying the wafer to be treated and disposed adjacent to the first belt conveyer 10, and a first arm type wafer carrying means which is composed of a pair of guide rails 11, 11, a pair of sliders 17, 17, slidably mounted on the guide rails 11, 11, respectively, in the horizontal direction, and a pair of first arms 4, 4, for carrying the wafer to be treated which are fixed to said sliders 17, 17, extended horizontally along said second belt conveyer 5 and are shaped to be a pair of parallel rods spaced at a certain distance to each other with a certain length to be movable horizontally with the sliders 17, 17. A pair of wire conveyers may also be used instead of the belt conveyer.

In FIG. 1, the reaction chamber 1 is opened to a preliminary vacuum chambers 13, 13' through a pair of slits 14, 14', in which a pair of vacuum sealing devices 3, 3', incorporating therein a pair of gate valve type shutters 20, 20', respectively. The slits 14, 14' are opened and closed as the shutters 20, 20' are opened and closed respectively. The reaction chamber 1 is provided with a first electrode 2 which is connected to a power source (not shown). The reaction chamber 1 is further provided with a wafer table 6 serving as a second electrode, which is faced to the first electrode 2 and insulated from the surrounding environment, a sub-table 7 which is fittable vacuum-tightly in the center of the wafer table 6 along with a shaft 7' integral therewith and is vertically movable by means of an elevator cylinder 7'', a plasma gas nozzle 15, and a vacuum line 16. The slits 14, 14' may have such a size that arms 4, 4, and 4', 4', with the wafer 12 mounted thereon may pass therethrough, respectively, the smaller the better.

Figure 4:
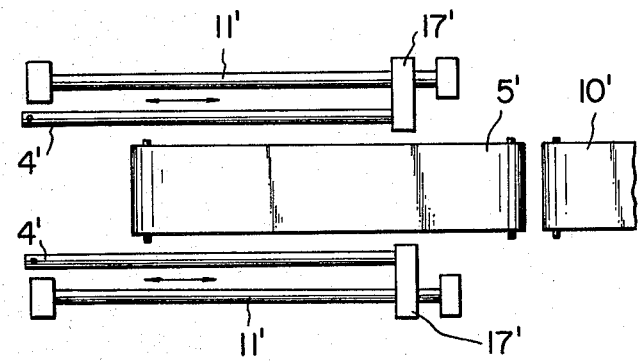
FIG. 4 is a schematic plan view showing one embodiment of a first belt conveyer for carrying a treated wafer and an arm type wafer carrying means for carrying a treated wafer according to the apparatus of this invention.

In FIGS. 1 and 4, the second wafer carrying means substantially consists of a second arm type wafer carrying means which is composed of a pair of guide rails 11', 11', a pair of sliders 17', 17', slidably mounted on the guide rails 11', 11', respectively, in the horizontal direction, and a pair of second arms 4', 4', for carrying the treated wafer which extends horizontally along a third belt conveyer 5' for carrying the treated wafer and are shaped to be a pair of parallel rods spaced at a certain distance to each other with a certain length to be movable horizontally with the sliders 17', 17', the third belt conveyer 5', a fourth belt conveyer 10' for carrying the treated wafer and disposed adjacent to the third belt conveyer 5', a second cassette elevator 9', and second wafer cassette 8' which is mounted on the second cassette elevator 9' and is disposed adjacent to the fourth belt conveyer 10'.

In FIG. 1, the first wafer carrying means, and the second wafer carrying means are all placed in a preliminary vacuum chambers 13, 13'. In FIGS. 1, 3 and 4, the arms 4, 4 and 4', 4' are spaced to each other such that the wafer to be treated and the treated wafer may be safely placed thereon respectively, and have such a length that the wafer to be treated may be carried to the center of the reaction chamber by the arms 4, 4 so as to be put on the sub-table elevated thereon, and that the treated wafer may be carried from the center of the reaction chamber to the third belt conveyer 5' by the arms 4', 4', respectively.

The first arm type wafer carrying means and the second arm type wafer carrying means are disposed outside the second belt conveyer 5 and the third belt conveyer 5', respectively.

The sub-table 7 should have such a size that the wafer can be safely mounted thereon and that it can pass between a pair of arms.

The control means of the apparatus in the present invention is substantially composed of a microcomputer (not shown) located in the drive control. That is, the control means for bringing the individual parts into a harmonized linkage motion may be a programmed control means well-known in the control of various kinds of machine tools for automatic machining. For example, each of a plurality of cams fixed to a revolving shaft serves to start and stop the motion of one of the individual parts in a predetermined schedule. Alternatively, the linkage motion can be controlled by a series of electric relays. The microcomputer is incorporated in a drive control as shown in FIG. 1.

In FIG. 1, wafers to be treated are stored in a first wafer cassette 8 mounted on a first cassette elevator 9. A lowermost wafer 12 stored in the first wafer cassette 8 is carried by the first belt conveyor 10 and by the second belt conveyor 5 successively to the tip sections of the arms 4, 4 to be mounted thereon. Then the shutter 20 of the vacuum sealing device 3 is opened so that the wafer 12 may be carried through the slit 14 to the center of the reaction chamber 1 by means of the first arm type wafer carrying means as shown in FIG. 2(B). As another embodiment, a wafer to be treated may be supplied directly from a preceding step by a conveyer (not shown) without being stored in the first wafer cassette 8, where another vacuum sealing device may be provided for the preliminary vacuum chamber 13. The sub-table 7 is extended upward with the wafer 12 mounted thereon and taken up to a predetermined position above the arms 4, 4 as shown in FIG. 2(C). The arms 4, 4 are returned to the original position and the shutter 20 of the vacuum sealing device 3 is closed while the sub-table 7 is returned to the original position so that the wafer 12 may be placed on the wafer table 6. The reaction chamber 1 is evacuated to a predetermined vacuum by the vacuum line 16 connected to a vacuum pump (not shown), and a gas for plasma treatment is introduced thereinto through a plasma gas nozzle 15. A plasma is generated under vacuum with a radio frequency generator (not shown) by the application of the high voltage electrode 2 for the treatment of the wafer 12 by plasma reaction. After completion of the treatment, the wafer 12 is elevated to the predetermined position in the same manner as in FIG. 2(C) while being mounted on the sub-table 7. The shutter 20' of the vacuum sealing device 3' is then opened and the arms 4', 4' extend through the slit 14' so that the tip sections thereof reach the center of the reaction chamber 1 beneath the wafer 12 mounted on the sub-table 7 elevated as above. The sub-table 7 with the wafer 12 mounted thereon is returned to the original position, while the wafer 12 is placed on the tip sections of the arms 4', 4' on the way. The wafer 12 is carried out of the reaction chamber 1 by the second arm type wafer carrying means to the third belt conveyor 5' so as to be carried to the fourth belt conveyor 10', and the shutter 20' of the vacuum sealing device 3' is closed. The wafer 12 is further carried to be stored in the second wafer cassette 8' mounted on the second cassette elevator 9'. As another embodiment, the treated wafer may be supplied directly to a succeeding step by a conveyer (not shown) without being stored in the second wafer cassette 8', where another vacuum sealing device may be provided for the preliminary vacuum chamber 13. On the other hand, another wafer to be treated is being taken out of the first wafer cassette 8 to be carried for the treatment in the same manner as described above. All the procedures described above are controlled by a microcomputer in linkage motion.

In accordance with the apparatus of the present invention, the first wafer carrying means, the reaction chamber, and the second wafer carrying means can be made compact and simplified in structure such that the reaction chamber and the preliminary vacuum chamber can be greatly reduced in size. The compact and simplified structure of the first wafer carrying means, the reaction chamber, and the second wafer carrying means combines with the reduced size of the slits in the reaction chamber to make it possible to obtain a high vacuum in the reaction chamber, which makes the apparatus of the present invention suitable for use in an etching device of aluminum wiring and the like, where a high vacuum in the reaction chamber is required.

In accordance with the apparatus of the present invention, a highly efficient apparatus for the treatment of semiconductor wafers by plasma reaction can be provided with little trouble due to simplified driving mechanisms thereof.

Further, the present invention can provide an apparatus for the treatment of semiconductor wafers by plasma reaction with excellent advantages such as a narrow scatter of results from the treatment of respective wafers, high processing precision, and short treating time per one sheet of wafer without causing any damage to the wafer.

What is claimed is:

1. An apparatus for the treatment of semiconductor wafers by plasma reaction, which apparatus comprises a first wafer carrying means for a wafer to be treated which comprises a first conveyer for carrying the wafer to be treated, a second conveyer for carrying the wafer to be treated and disposed adjacent to said first conveyer, and a first arm type wafer carrying means, said first arm type wafer carrying means essentially consisting of a pair of guide rails, a pair of sliders slidably mounted on said guide rails respectively in the horizontal direction, and a pair of first arms for carrying the wafer to be treated, said first arms extending horizontally along said second conveyer and being shaped to be a pair of parallel rods spaced at a certain distance to each other with a certain length to be movable horizontally with said sliders; a reaction chamber provided with a pair of slits for taking the wafer to be treated into said reaction chamber or for taking a treated wafer out of said reaction chamber therethrough, respectively, a pair of vacuum sealing devices mounted on said slits and incorporating therein a pair of gate valve type shutters, respectively, a first electrode, a wafer table serving as a second electrode, faced to said first electrode and insulated from the surrounding environment, a sub-table which is fittable vacuum-tightly in the center of said wafer table along with a shaft integral therewith and is vertically movable by an elevator cylinder, a plasma gas nozzle, and a vacuum line; a second wafer carrying means for a treated wafer which comprises a second arm type wafer carrying means essentially consisting of a pair of guide rails, a pair of sliders slidably mounted on said guide rails respectively in the horizontal direction, and a pair of second arms for carrying the treated wafer, said second arms extending horizontally along a third conveyer for carrying the treated wafer and being shaped to be a pair of parallel rods spaced at a certain distance to each other with a certain length to be movable horizontally with said sliders; a third conveyer for carrying the treated wafer, and a fourth conveyer for carrying the treated wafer and disposed adjacent to said third conveyer; and a control means for driving said first wafer carrying means, said reaction chamber, and said second wafer carrying means in linkage motion.

2. An apparatus according to claim 1, wherein the first wafer carrying means further comprises a first wafer cassette elevator disposed adjacent to said first conveyor, and a first wafer cassette mounted thereon; and the second wafer carrying means further comprises a second wafer cassette elevator disposed adjacent said fourth conveyor, and a second wafer cassette mounted thereon.

3. An apparatus according to claim 1, wherein said first wafer carrying means, said reaction chamber, and said second wafer carrying means are placed in a preliminary vacuum chamber opened to said reaction chamber through said slits.

4. An apparatus according to claim 1, wherein said first arms and said second arms are spaced to each other such that the wafer to be treated and the treated wafer may be safely placed thereon, respectively, and have such a length that the tip sections thereof can reach the center of said reaction chamber.

5. An apparatus according to claim 1, wherein said slits have such a size that said first arms and said second arms can pass therethrough respectively with the wafer to be treated and the treated wafer mounted thereon, respectively.

6. An apparatus according to claim 1, wherein said sub-table has such a size that a wafer can be safely mounted thereon and that said sub-table can pass between a pair of arms.

7. An apparatus according to claim 1, wherein said control means essentially consists of a microcomputer.

* * * * *